United States Patent
Kato et al.

(10) Patent No.: US 10,207,473 B2
(45) Date of Patent: Feb. 19, 2019

(54) HEAT-CONDUCTING FOAM SHEET FOR ELECTRONIC DEVICES

(71) Applicant: SEKISUI CHEMICAL CO., LTD., Osaka (JP)

(72) Inventors: Tetsuhiro Kato, Kyoto (JP); Naoyuki Nagatani, Shunan (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/513,249

(22) PCT Filed: Sep. 30, 2015

(86) PCT No.: PCT/JP2015/077691
§ 371 (c)(1),
(2) Date: Mar. 22, 2017

(87) PCT Pub. No.: WO2016/052599
PCT Pub. Date: Apr. 7, 2016

(65) Prior Publication Data
US 2017/0305106 A1    Oct. 26, 2017

(30) Foreign Application Priority Data

Sep. 30, 2014  (JP) ................. 2014-201686

(51) Int. Cl.
| | | |
|---|---|---|
| *B32B 5/18* | (2006.01) | |
| *B32B 7/12* | (2006.01) | |
| *C08J 9/00* | (2006.01) | |
| *C08J 9/14* | (2006.01) | |
| *B32B 27/06* | (2006.01) | |
| *B32B 27/36* | (2006.01) | |
| *H01L 23/373* | (2006.01) | |
| *C08J 9/30* | (2006.01) | |
| *C08K 3/34* | (2006.01) | |

(52) U.S. Cl.
CPC ............... *B32B 5/18* (2013.01); *B32B 7/12* (2013.01); *B32B 27/065* (2013.01); *B32B 27/36* (2013.01); *C08J 9/0066* (2013.01); *H01L 23/3733* (2013.01); *H01L 23/3737* (2013.01); *B32B 2250/02* (2013.01); *B32B 2307/54* (2013.01); *C08J 9/142* (2013.01); *C08J 9/30* (2013.01); *C08J 2201/026* (2013.01); *C08J 2203/12* (2013.01); *C08J 2383/04* (2013.01); *C08K 3/34* (2013.01); *C09J 2201/606* (2013.01); *H01L 23/3731* (2013.01)

(58) Field of Classification Search
CPC ............ B29D 11/00298; G02B 13/003; G02B 13/0035; G02B 13/004; G02B 13/0045; G02B 13/005; G02B 13/0085; G02B 3/0006; G02B 3/0062; G02B 5/20; G02B 7/003; G02B 9/04; G03B 17/12; H04N 5/2257

USPC ....... 348/E5.031, 164, 222.1, 280, 302, 345; 359/621, 784
See application file for complete search history.

(56) References Cited

U.S. PATENT DOCUMENTS

| | | | | | |
|---|---|---|---|---|---|
| 4,550,003 | A | * | 10/1985 | Sakata | C08J 9/143 264/53 |
| 4,928,206 | A | * | 5/1990 | Porter | H05K 1/189 165/104.33 |
| 5,023,442 | A | * | 6/1991 | Taniguchi | B41J 2/451 250/208.1 |
| 5,177,969 | A | * | 1/1993 | Schneider | B25J 9/14 60/527 |
| 5,270,859 | A | * | 12/1993 | Wirth | G02B 3/0062 359/419 |
| 5,444,520 | A | * | 8/1995 | Murano | B41J 2/465 347/244 |
| 5,581,379 | A | * | 12/1996 | Aoyama | G02B 3/0018 349/5 |
| 6,803,939 | B2 | * | 10/2004 | Shimizu | B41J 2/451 347/130 |
| 6,849,915 | B1 | * | 2/2005 | Tsai | H01L 31/0203 257/432 |
| 8,804,255 | B2 | * | 8/2014 | Duparre | B29D 11/00298 359/621 |
| 9,627,572 | B2 | * | 4/2017 | Okushiba | G01S 7/4813 |
| 9,629,283 | B2 | * | 4/2017 | Soong | H05K 7/2039 |
| 9,711,552 | B2 | * | 7/2017 | Rudmann | H01L 27/14625 |
| 2003/0017320 | A1 | * | 1/2003 | Ebihara | B32B 5/18 428/306.6 |

(Continued)

FOREIGN PATENT DOCUMENTS

| | | | | | |
|---|---|---|---|---|---|
| DE | 102006044323 | A1 | * | 3/2008 | ............... C09D 1/00 |
| DE | 102006044323 | A1 | * | 3/2008 | ............... C09D 1/00 |
| EP | 1061190 | A1 | * | 12/2000 | ............... E04B 1/86 |
| EP | 1061190 | A1 | * | 12/2000 | ............... E04B 1/86 |
| JP | 3976166 | | | 9/2007 | |
| JP | 2012-153774 | | | 8/2012 | |
| JP | 2013-95761 | | | 5/2013 | |
| JP | 2013-231166 | | | 11/2013 | |

OTHER PUBLICATIONS

International Search Report dated Dec. 28, 2015 in International (PCT) Application No. PCT/JP2015/077691.

*Primary Examiner* — Edward Chin
(74) *Attorney, Agent, or Firm* — Wenderoth, Lind & Ponack, L.L.P.

(57) ABSTRACT

A thermally conductive foam sheet for electronic equipment according to the present invention is a sheet-shaped foam sheet comprising a silicone resin (A), and thermal conductor particles (B) and bubbles dispersed in the silicone resin (A), wherein a content of the thermal conductor particles (B) is 100 to 400 parts by mass based on 100 parts by mass of the silicone resin (A), and the foam sheet further has a 25% compressive strength of 200 kPa or less and a thickness of 0.8 mm or less.

7 Claims, No Drawings

(56) References Cited

U.S. PATENT DOCUMENTS

| | | | |
|---|---|---|---|
| 2011/0080487 A1* | 4/2011 | Venkataraman | H04N 5/2253 348/218.1 |
| 2011/0122308 A1* | 5/2011 | Duparre | H01L 27/14621 348/340 |
| 2011/0176020 A1* | 7/2011 | Chang | G03B 17/12 348/222.1 |
| 2012/0057100 A1* | 3/2012 | Masuda | B29C 33/3878 349/62 |
| 2014/0125810 A1* | 5/2014 | D'Amico | H04N 5/2258 348/164 |
| 2017/0187933 A1* | 6/2017 | Duparre | H01L 27/14621 |

* cited by examiner

HEAT-CONDUCTING FOAM SHEET FOR ELECTRONIC DEVICES

TECHNICAL FIELD

The present invention relates to a thermally conductive foam sheet for electronic equipment for efficiently dissipating heat inside electronic equipment to the outside.

BACKGROUND ART

In electronic equipment of which miniaturization is required such as a smartphone, an electronic component integrated at high density generates a large amount of heat. Since this heat may cause failure, a heat sink material for dissipating the heat outside the equipment is provided. The heat sink material is generally provided between an electronic component that is a heat-generating member and a metal housing. Therefore, heat-dissipating greases, heat-dissipating gels, urethane foams impregnated with these, and the like, which have high conformability to unevenness, are used as the heat sink material (for example, Patent Literature 1).

CITATION LIST

Patent Literature

PTL1: JP 3976166 B

SUMMARY OF INVENTION

Technical Problem

The heat-dissipating grease has good heat dissipation properties, but the problem is that once the grease is applied, it is difficult to reapply it to thereby decrease the yields of products. On the other hand, in the case of the heat-dissipating gel, there are problems that it is generally difficult to process it into the sheet shape having a thickness of 1 mm or less, and also that the shape deforms when the heat-dissipating gel is compressed.

In addition, in the case of the urethane foam impregnated with heat-dissipating grease, heat-dissipating gel, or the like described above, there are problems that it is also difficult to process it into the sheet shape having a thickness of 1 mm or less in terms of the manufacturing method, and also that even if it is processed into thin sheet shape, the compressive strength increases to thereby lose the flexibility.

Solution to Problem

The present invention has been made in view of the above problems, and it is an object of the present invention to provide a thermally conductive foam sheet having the thinness and flexibility sufficient to be suitably used inside electronic equipment and having excellent thermal conductivity.

As a result of diligent studies, the present inventors have found that by making a foam with incorporating bubbles into a silicone resin having thermally conductive particles, flexibility is provided to a silicone resin sheet together with good thermal conductivity, and thus that the silicone resin sheet is useful as a heat sink material for small electronic equipment, thereby completing the present invention. The present invention provides the following (1) to (8).

(1) A thermally conductive foam sheet for electronic equipment, comprising a silicone resin (A), and thermal conductor particles (B) and bubbles dispersed in the silicone resin (A), wherein
a content of the thermal conductor particles (B) is 100 to 400 parts by mass based on 100 parts by mass of the silicone resin (A), and
the thermally conductive foam sheet has a 25% compressive strength of 200 kPa or less and a thickness of 0.8 mm or less.
(2) The thermally conductive foam sheet for electronic equipment according to the above (1), having a 50% compressive strength of 200 kPa or less.
(3) The thermally conductive foam sheet for electronic equipment according to the above (1) or (2), wherein the thermal conductor particles (B) have an average particle diameter of 50 μm or less and a thermal conductivity of 8 W/m·K or more.
(4) The thermally conductive foam sheet for electronic equipment according to any of the above (1) to (3), wherein the thermal conductor particles (B) are of at least one selected from a group consisting of aluminum oxide, magnesium oxide, boron nitride, talc, and aluminum nitride.
(5) The thermally conductive foam sheet for electronic equipment according to any of the above (1) to (4), having a thermal conductivity of 0.1 to 10 W/m·K.
(6) The thermally conductive foam sheet for electronic equipment according to any of the above (1) to (5), having an expansion ratio of 1.5 to 5.
(7) The thermally conductive foam sheet for electronic equipment according to any of the above (1) to (6), wherein the bubbles are formed by foaming with a physical foaming agent, formed by a gas mixed by a mechanical frothing method, or both thereof.
(8) A method of manufacturing the thermally conductive foam sheet for electronic equipment according to any of the above (1) to (7), comprising: forming bubbles in a foam composition comprising a curable silicone resin composition and thermally conductive particles (B); and curing the curable silicone resin composition to obtain a foam sheet.

Advantageous Effects of Invention

According to the present invention, it is possible to provide a thermally conductive foam sheet for electronic equipment having the thinness and flexibility sufficient to be suitably used inside electronic equipment and having excellent thermal conductivity.

DESCRIPTION OF EMBODIMENTS

The present invention will be described in more detail below using embodiments.

A thermally conductive foam sheet for electronic equipment (hereinafter also simply referred to as a "foam sheet") according to the present invention comprises a silicone resin (A) and thermal conductor particles (B) and bubbles dispersed in the silicone resin (A).

[Silicone Resin (A)]

The silicone resin (A) is obtained by curing a curable silicone resin composition and is preferably a two-part liquid and addition reaction type silicone resin. Such a curable silicone resin composition is composed of, for example, (A1) an organopolysiloxane having at least two alkenyl groups in one molecule, (A2) an organohydrogenpolysiloxane having at least two hydrogen atoms bonded to silicon atoms in one molecule, and (A3) a platinum-based catalyst.

The organopolysiloxane that is the component (A1) constitutes a base resin for the silicone resin and has at least two alkenyl groups bonded to silicon atoms. Examples of the alkenyl group include a vinyl group and an allyl group. In addition, examples of organic groups bonded to silicon atoms other than the alkenyl groups include alkyl groups having 1 to 3 carbon atoms such as a methyl group, an ethyl group, and a propyl group; aryl groups such as a phenyl group and a tolyl group; and substituted alkyl groups such as a 3,3,3-trifluoropropyl group and a 3-chloropropyl group. The molecular structure of the component (A1) may be either linear or branched-chain.

The molecular weight of the component (A1) is not particularly limited, but the viscosity at 23° C. is preferably 0.1 Pa·s or more, more preferably 0.3 to 15 Pa·s, and further preferably 0.5 to 10 Pa·s. In the present invention, two or more of the above organopolysiloxanes may be used in combination. The viscosity is measured according to JISZ8803 using a capillary viscometer.

The organohydrogenpolysiloxane that is the component (A2) constitutes a curing agent, and the hydrogen atoms bonded to silicon atoms in the component (A2) undergo an addition reaction with the alkenyl groups bonded to silicon atoms of the organopolysiloxane in the component (A1) in the presence of the platinum-based catalyst of the component (A3) to crosslink and cure the curable silicone resin composition. The component (A2) needs to have at least two hydrogen atoms bonded to silicon atoms in one molecule. In the component (A2), examples of organic groups bonded to silicon atoms include alkyl groups having 1 to 3 carbon atoms such as a methyl group, an ethyl group, and a propyl group; aryl groups such as a phenyl group and a tolyl group; and halogen atom-substituted alkyl groups such as a 3,3,3-trifluoropropyl group and a 3-chloropropyl group. The molecular structure of the component (A2) may be any of linear, branched-chain, cyclic, and network-like structures.

The molecular weight of the component (A2) is not particularly limited, but the viscosity at 23° C. is preferably 0.005 to 8 Pa·s, more preferably 0.01 to 4 Pa·s.

As for the amount of the component (A2), the component (A2) is added such that the molar ratio of the hydrogen atoms bonded to silicon atoms in this component to the alkenyl groups bonded to silicon atoms in the component (A1) is in the range of (0.5:1) to (20:1), and the molar ratio is preferably in the range of (1:1) to (3:1). When this molar ratio is 0.5 or more, the curability is relatively good, and when this molar ratio is 20 or less, the hardness of the foam sheet is of suitable magnitude.

The platinum-based catalyst that is the component (A3) is used for curing the curable silicone resin composition. Examples of the platinum-based catalyst include platinum fine powders, platinum black, chloroplatinic acid, platinum tetrachloride, olefin complexes of chloroplatinic acid, alcohol solutions of chloroplatinic acid, complex compounds of chloroplatinic acid and alkenylsiloxanes, rhodium compounds, and palladium compounds. In addition, in order to increase the pot life of the curable silicone resin composition, thermoplastic resin particles containing any of these platinum-based catalysts may be used.

The amount of this platinum-based catalyst added is usually 0.1 to 500 parts by mass, preferably in the range of 1 to 50 parts by mass, in terms of a platinum-based metal, based on 1,000,000 parts by mass of the component (A1). By setting the amount of the platinum-based catalyst added to 0.1 parts by mass or more, the addition reaction can proceed suitably. By setting the amount of the platinum-based catalyst added to 500 parts by mass or less, the present invention can be carried out economically. The platinum-based catalyst of the component (A3) is usually previously added to either a base resin or a curing agent in a two-part curable type.

Examples of commercial products of the curable silicone resin composition include a two-component heat-curable liquid silicone rubber "TSE3032" manufactured by Momentive Performance Materials Japan LLC.

In the curable silicone resin composition having the above configuration, the parts by mass of the silicone resin (A) described later means the total parts by mass of the above base resin (component (A1)) and the curing agent (component (A2)), but the total amount of the components (A1) to (A3) (that is, the amount of the curable silicone resin composition) can be considered as the parts by mass of the silicone resin (A) because the amount of the component (A3) is usually negligible.

<Thermal Conductor Particles (B)>

Examples of the thermal conductor particles (B) include aluminum oxide, magnesium oxide, boron nitride, talc, aluminum nitride, graphite, and graphene. Among these, aluminum oxide, magnesium oxide, boron nitride, talc, and aluminum nitride are preferred. One of these thermal conductor particles (B) may be used alone, or two or more of these thermal conductor particles (B) may be mixed and used.

The thermal conductivity of the thermal conductor particles (B) is preferably 8 W/m·K or more, more preferably 15 W/m·K or more, and further preferably 20 W/m·K or more. When the thermal conductivity is in the above ranges, the thermal conductivity of the foam sheet is sufficiently high. The upper limit of the thermal conductivity of the thermal conductor particles (B) is not particularly limited but is usually 100 W/m·K or less.

The average particle diameter of the thermal conductor particles (B) is preferably 50 μm or less, more preferably 30 μm or less, and further preferably 15 μm or less. When the particle diameter of the thermal conductor particles (B) is in these ranges, the foam is easily made thinner, and a foam sheet having good foamability is obtained. In addition, the lower limit of the average particle diameter of the thermal conductor particles (B) is not particularly limited but is usually 0.5 μm or more, preferably 1 μm or more. The average particle diameter of the thermal conductor particles (B) is a value measured by a particle size distribution meter.

In the foam sheet, the thermal conductor particles (B) are contained in an amount of 100 to 400 parts by mass based on 100 parts by mass of the silicone resin (A). When the content of the thermal conductor particles (B) is less than 100 parts by mass, sufficient thermal conductivity cannot be provided to the foam sheet. On the other hand, when the content of the thermal conductor particles (B) is more than 400 parts by mass, the flexibility of the foam sheet decreases.

The content of the thermal conductor particles (B) based on 100 parts by mass of the silicone resin (A) is preferably 150 to 350 parts by mass, more preferably 200 to 300 parts by mass, in view of the thermal conductivity and flexibility of the foam sheet.

<Bubbles>

A plurality of bubbles are contained in the foam sheet of the present invention. The plurality of bubbles may be formed by foaming with a foaming agent such as a physical foaming agent or formed by a gas mixed by a mechanical frothing method. Alternatively, foaming particles that have been previously foamed may be contained in the foam sheet and the hollow portions in the foaming particles may be used as the bubbles.

Two or more methods of these may be combined. Specifically, foaming with a physical foaming agent and the mechanical frothing method are preferably combined to form bubbles. By forming bubbles by such methods, good foaming with uniform bubbles is possible.

By having an infinite number of bubbles, the foam sheet of the present invention has excellent flexibility while containing the thermally conductive particles (B) and has a 25% compressive strength of 200 kPa or less. When the 25% compressive strength is more than 200 kPa, the flexibility of the foam sheet decreases to cause insufficient conformability to unevenness and the like, and thus performance sufficient as a heat sink material for electronic equipment cannot be exhibited. In view of the flexibility of the foam sheet, the 25% compressive strength of the foam sheet is preferably 20 to 150 kPa, more preferably 25 to 100 kPa.

In addition, the 50% compressive strength of the foam sheet is preferably 200 kPa or less, more preferably 50 to 190 kPa, and further preferably 55 to 180 kPa. When the 25% compressive strength and the 50% compressive strength are in the above ranges, the flexibility of the foam sheet can be improved while the thermal conductivity is increased, and the conformability to unevenness and the like are also good.

In addition, the foam sheet has a thickness of 0.8 mm or less. When the thickness of the foam sheet is more than 0.8 mm, it is difficult to use the foam sheet in a gap inside small electronic equipment. The thickness of the foam sheet is preferably 0.05 to 0.6 mm, more preferably 0.05 to 0.5 mm, in view of the strength and the like of the foam sheet.

In addition, the expansion ratio of the foam sheet is typically about 1.2 to 7 and is preferably 1.5 to 5. By setting the expansion ratio to 5 or less, the thermal conductivity is good, even if the foam sheet is made thin, and thus the foam sheet can be suitably used as a heat sink material. In addition, when the expansion ratio is 1.5 or more, the flexibility is appropriate. In view of improving the flexibility and the thermal conductivity with a good balance, the expansion ratio is more preferably 2.0 to 4.0, further preferably 2.5 to 3.5.

Further, the apparent density of the foam sheet is preferably 0.3 to 1.3 $g/cm^3$. When the apparent density is in the above range, a foam sheet having both good flexibility and thermal conductivity can be obtained even though it is thin. In addition, the apparent density is more preferably 0.4 to 1.0 $g/cm^3$, further preferably 0.5 to 0.9 $g/cm^3$. When the apparent density of the foam sheet is in these ranges, both the flexibility and the thermal conductivity can be improved with a good balance.

The above expansion ratio and apparent density can be appropriately adjusted by changing the amount of the foaming agent used, the amount of the gas mixed by the mechanical frothing method, the content of the foaming particles that have been previously foamed, or the like.

The thermal conductivity of the foam sheet is preferably 0.1 to 10 W/m·K, more preferably 0.13 to 2.0 W/m·K, and further preferably 0.25 to 2.0 W/m·K. When the thermal conductivity of the foam sheet is in the above ranges, heat inside electronic equipment can be efficiently dissipated to the outside.

<Optional Components>

Various additive components can be contained in the foam sheet as needed, as long as the object of the present invention is not impaired.

The types of the additive components are not particularly limited, and various additives which is usually used for foaming and processing can be used. Examples of such additives include lubricants, shrinkage inhibitors, bubble nucleating agents, crystal nucleating agents, plasticizers, colorants (pigments, dyes, and the like), ultraviolet absorbing agents, antioxidants, anti-aging agents, fillers other than the above thermally conductive particles (B), reinforcing agents, flame retardants, flame-retardant aids, antistatic agents, surfactants, vulcanizing agents, and surface treatment agents. The amounts of the additives added can be appropriately selected as long as that do not impair the formation of bubbles, and the like, and the amounts added used for usual foaming and molding of a resin can be adopted. Such additives can be used alone, or two or more of such additives can be used in combination. Among these, a lubricant, a flame retardant, and a flame-retardant aid are preferably used.

The lubricant has the function of improving the fluidity of the silicone resin (A) and suppressing the thermal deterioration of the resin. The lubricant is not particularly limited as long as it has an effect on the improvement of the fluidity of the resin (A). Examples of the lubricant include hydrocarbon-based lubricants such as liquid paraffin, paraffin wax, microwax, and polyethylene wax; fatty acid-based lubricants such as stearic acid, behenic acid, and 12-hydroxystearic acid; and ester-based lubricants such as butyl stearate, stearic acid monoglyceride, pentaerythritol tetrastearate, hydrogenated castor oil, and stearyl stearate.

The amount of the lubricant added is preferably about 0.01 to 5 parts by mass, more preferably 0.05 to 4 parts by mass, and further preferably 0.1 to 3 parts by mass based on 100 parts by mass of the silicone resin (A). By setting the amount added to 5 parts by mass or less, the expansion ratio is easily made good while the fluidity is made suitable. By setting the amount added to 0.01 parts by mass or more, the fluidity enhances to thereby improve the stretchability during foaming, and thus the expansion ratio is easily increased.

Examples of the flame retardant include metal hydroxides such as aluminum hydroxide and magnesium hydroxide, and also bromine-based flame retardants such as decabromodiphenyl ether, and phosphorus-based flame retardants such as ammonium polyphosphate.

Examples of the flame-retardant aid include antimony compounds such as antimony trioxide, antimony tetroxide, antimony pentoxide, sodium pyroantimonate, antimony trichloride, antimony trisulfide, antimony oxychloride, antimony dichloride perchloropentane, and potassium antimonate, boron compounds such as zinc metaborate, zinc tetraborate, zinc borate, and basic zinc borate, zirconium oxides, tin oxides, and molybdenum oxides.

The foam sheet of the present invention can be used as a sheet-shaped heat sink material inside electronic equipment. The heat sink material is disposed between a heat-generating member inside electrical equipment and a housing. Examples of the heat-generating member include CPUs, batteries, and so on.

The foam sheet of the present invention has excellent thermal conductivity while having small thickness, and therefore, when it is used as a heat sink material inside electronic equipment, heat generated by a heat-generating member can be efficiently dissipated to the outside. In addition, the foam sheet of the present invention also has excellent flexibility, and therefore it has excellent conformability to unevenness and thus can be disposed even in narrow gap or the like without creating interspace.

The electronic equipment in which the foam sheet of the present invention is used is not particularly limited, but portable equipment such as cellular phones including smartphones, tablet terminals, electronic paper, notebook PCs, video cameras, and digital cameras is preferred.

<Method of Manufacturing Foam Sheet>

A method of manufacturing a foam sheet according to the present invention is a method in which bubbles are formed in a foam composition comprising a curable silicone resin composition and thermally conductive particles (B), and the curable silicone resin composition is cured to produce a foam sheet. In the manufacturing method, the bubbles are formed for producing the foam sheet, utilizing for example, a method of foaming with a foaming agent, a method of forming bubbles by a mechanical frothing method, or a method of blending foaming particles that have been previously foamed; but the manufacturing method is not particularly limited thereto.

Specifically, when a foaming agent is used, first, the components (that is, the components (A1), (A2), and (A3)) of a curable silicone resin composition, the thermally conductive particles (B), optional components blended as needed, and the foaming agent are mixed to obtain a foam composition. The obtained foam composition is processed into a sheet shape and then heated to foam by the foaming agent and cure the curable silicone resin composition, thereby producing a foam sheet.

Examples of the foaming agent used herein include physical foaming agents and chemical foaming agents, and physical foaming agents are preferred. The physical foaming agent generates a gas without decomposing the foaming agent. Specific examples of the physical foaming agents include volatile organic solvents. Examples of the volatile organic solvents include chain or cyclic hydrocarbons such as butane, pentane, hexane, octane, nonane, decane, undecane, cyclopentane, and cyclohexane, ketones such as cyclopentanone, cyclohexanone, and methyl ethyl ketone, esters such as ethyl acetate and butyl acetate, ethers such as tetrahydrofuran, aromatics such as benzene, toluene, xylene, and ethylbenzene, nitrogen-containing compounds such as acetonitrile and N,N-dimethylformamide, and halogen-containing compounds such as methylene chloride, chloroform, and chlorofluorocarbons. These physical foaming agents may be used alone, or two or more of these physical foaming agents may be used in combination. Among these, methyl ethyl ketone is preferably used.

Examples of the chemical foaming agents include thermally decomposable foaming agents, which decompose by heating to result in foaming. The thermally decomposable foaming agents are not particularly limited. Examples of the thermally decomposable foaming agents include azodicarbonamide, N,N'-dinitrosopentamethylenetetramine, and p-toluenesulfonylsemicarbazide. Among these, azodicarbonamide is preferred. One thermally decomposable foaming agent may be used alone, or two or more thermally decomposable foaming agents may be used in combination.

The amount of the foaming agent blended can be determined according to the desired expansion ratio but is, for example, 0.5 to 20 parts by mass, preferably 1 to 15 parts by mass, based on 100 parts by mass of the curable silicone resin composition.

When the mechanical frothing method is used, first, the components of a curable silicone resin composition, the thermally conductive particles (B), and optional components blended as needed are kneaded by a kneading machine such as a Banbury mixer or a pressure kneader while a gas is injected, thereby obtaining a foam composition in which bubbles are formed. For the gas, nitrogen, air, carbon dioxide, argon, and the like can be used. The obtained foam composition is then processed into a sheet shape and heated to cure the curable silicone resin composition to produce a foam sheet.

In the method using foaming particles that have been previously foamed, it is preferred that a foam composition comprising the components of a curable silicone resin composition and foaming particles that have been previously foamed be processed into a sheet shape and then heated to cure the curable silicone resin composition to obtain a foam sheet.

As the method of previously foaming for the foaming particles, it is preferred that a part of a curable silicone resin composition (preferably a part of a base resin) for constituting a foam sheet and foamable particles are mixed and then the foamable particles are foamed. The remainder of the curable silicone resin composition and other optional components and the like are further blended into the mixture of the foaming particles that have been foamed and the part of the curable silicone resin composition to obtain a foam composition.

The foamable particles used herein are preferably thermally expandable microcapsules. In the thermally expandable microcapsules, a volatile substance such as a low boiling point solvent is contained inside an outer shell resin. By heating, the outer shell resin softens, and the contained volatile substance volatilizes or expands. Thus, the outer shells expand due to the pressure, and the particle diameter increases.

The outer shells of the thermally expandable microcapsules are preferably formed of a thermoplastic resin. For the thermoplastic resin, one or two or more selected from vinyl polymers of ethylene, styrene, vinyl acetate, vinyl chloride, vinylidene chloride, acrylonitrile, butadiene, chloroprene, and so on, and copolymers of these; polyamides such as nylon 6 and nylon 66; and polyesters such as polyethylene terephthalate can be used. Copolymers of acrylonitrile are preferred because the contained volatile substance does not easily pass through them. As the volatile substance contained inside the thermally expandable microcapsules, one or two or more low boiling point liquids selected from hydrocarbons having 3 to 7 carbon atoms such as propane, propylene, butene, normal butane, isobutane, isopentane, neopentane, normal pentane, hexane, and heptane; petroleum ether; halides of methane such as methyl chloride and methylene chloride; chlorofluorocarbons such as $CCl_3F$ and $CCl_2F_2$; tetraalkylsilanes such as tetramethylsilane and trimethylethylsilane; and the like are used.

Preferred examples of the thermally expandable microcapsules include microcapsules comprising a copolymer of acrylonitrile and vinylidene chloride as an outer shell resin and containing a hydrocarbon having 3 to 7 carbon atoms such as isobutane.

Bubbles may be formed utilizing two or more of the above-described methods in combination, and, for example, bubbles may be formed utilizing in combination the method using a foaming agent and the mechanical frothing method. In this case, a volatile organic solvent is also preferably used for the foaming agent. In this method, first, a silicone resin composition, the thermally conductive particles (B), optional components blended as needed, and a volatile organic solvent are kneaded by a kneading machine such as a Banbury mixer or a pressure kneader while the above-described gas is injected, thereby obtaining a foam composition in which bubbles are formed. This foam composition is processed into a sheet shape and then heated to foam with the foaming agent to further form bubbles and cure the silicone resin composition to obtain a foam sheet.

In the above manufacturing methods, the foam composition is preferably processed into a sheet shape by being continuously conveyed using calender molding, extruder molding, conveyor belt casting, gravure coating, slot die coating, knife coating, or the like.

EXAMPLES

The present invention will be described in more detail by Examples, but the present invention is not limited in any way by these examples.

In the present invention, the physical properties and the evaluation methods are as follows.

[Apparent Density]

The apparent density was measured according to JIS K 7222.

[Expansion Ratio]

The expansion ratio was calculated by dividing the specific gravity of a foam sheet by the specific gravity of a foam composition.

[Thermal Conductivity of Thermally Conductive Particles (B)]

The thermal conductivity of thermally conductive particles (B) is measured by a thermal conductivity measuring apparatus for a hot wire method, TC-1000 manufactured by ULVAC-RIKO, Inc.

[Average Particle Diameter of Thermally Conductive Particles (B)]

The average particle diameter of the thermally conductive particles (B) was measured by a particle size distribution meter Microtrac HRA by a laser diffraction scattering method.

[25% Compressive Strength]

The 25% compressive strength of a foam sheet in the thickness direction was measured according to JIS K6767-7.2.3 (JIS2009).

[50% Compressive Strength]

The 50% compressive strength of a foam sheet in the thickness direction was measured according to JIS K6767-7.2.3 (JIS2009).

[Thermal Conductivity of Foam Sheet]

The thermal conductivity was measured at 23° C. by a hot disk method using "TPS-1500" manufactured by Kyoto Electronics Manufacturing Co., Ltd.

Example 1

91 Parts by mass of "TSE3032A" (viscosity (23° C.): 4.2 Pa·s), which was the base resin of a silicone resin (two-component heat-curable liquid silicone rubber) manufactured by Momentive Performance Materials Japan LLC, and 9 parts by mass of "TSE3032B" (viscosity (23° C.): 0.7 Pa·s), which was the curing agent of the silicone resin, (100 parts by mass of a curable silicone resin composition when they were put together), 300 parts by mass of magnesium oxide (RF-10-SC, manufactured by Ube Material Industries, Ltd., average particle diameter: 5 μm, thermal conductivity: 50 W/m·K), and 3 parts by mass of methyl ethyl ketone as a foaming agent were uniformly mixed at ordinary temperature (23° C.), and while 100 mL/min of nitrogen gas was injected, the mixture was stirred by a high viscosity fluid stirring apparatus (manufactured by REICA Co., Ltd., product name "VIBRO PQLABO") at a number of revolutions of 500 rpm and a sample flow rate of 2000 mL/min to produce a foam composition in which bubbles were mixed.

The obtained foam composition was applied with a thickness of 150 μm to the release-treated surface of a PET sheet having a thickness of 50 μm whose one surface was release-treated. Then, another PET sheet having a thickness of 50 μm whose one surface was release-treated was disposed thereon so that the release-treated surface of the PET sheet was in contact with the applied foam composition, thereby obtaining a laminate. This laminate was heated in an oven at 115° C. for 2 minutes. The laminate was removed from the oven, and then the two PET sheets were peeled to obtain a 450 μm foam sheet.

Example 2

91 Parts by mass of the same base resin as in Example 1, 9 parts by mass of the same curing agent as in Example 1, 400 parts by mass of magnesium oxide, and 3 parts by mass of methyl ethyl ketone were uniformly mixed at ordinary temperature (23° C.), and while 100 mL/min of nitrogen gas was injected, the mixture was stirred by a high viscosity fluid stirring apparatus (manufactured by REICA Co., Ltd., product name "VIBRO PQLABO") at a number of revolutions of 500 rpm and a sample flow rate of 2000 mL/min to produce a foam composition in which bubbles were mixed.

The obtained foam composition was applied with a thickness of 150 μm to the release-treated surface of a PET sheet having a thickness of 50 μm whose one surface was release-treated. Then, another PET sheet having a thickness of 50 μm whose one surface was release-treated was disposed thereon so that the release-treated surface of the PET sheet was in contact with the applied foam composition, thereby obtaining a laminate. This laminate was heated in an oven at 115° C. for 2 minutes. The laminate was removed from the oven, and then the two PET sheets were peeled to obtain a 400 μm foam sheet.

Example 3

91 Parts by mass of the same base resin as in Example 1, 9 parts by mass of the same curing agent as in Example 1, 300 parts by mass of magnesium oxide, and 3 parts by mass of methyl ethyl ketone were uniformly mixed at ordinary temperature (23° C.), and while 300 mL/min of nitrogen gas was injected, the mixture was stirred by a high viscosity fluid stirring apparatus (manufactured by REICA Co., Ltd., product name "VIBRO PQLABO") at a number of revolutions of 500 rpm and a sample flow rate of 2000 mL/min to produce a foam composition in which bubbles were mixed.

The obtained foam composition was applied with a thickness of 100 μm to the release-treated surface of a PET sheet having a thickness of 50 μm whose one surface was release-treated. Then, another PET sheet having a thickness of 50 μm whose one surface was release-treated was disposed thereon so that the release-treated surface of the PET sheet was in contact with the applied foam composition, thereby obtaining a laminate. This laminate was heated in an oven at 115° C. for 2 minutes. The laminate was removed from the oven, and then the two PET sheets were peeled to obtain a 660 μm foam sheet.

Comparative Example 1

91 Parts by mass of the same base resin as in Example 1, 9 parts by mass of the same curing agent as in Example 1, and 300 parts by mass of magnesium oxide were uniformly mixed to obtain a composition. The obtained composition was applied with a thickness of 430 μm to the release-treated surface of a PET sheet having a thickness of 50 μm whose one surface was release-treated. Then, another PET sheet having a thickness of 50 μm whose one surface was release-treated was disposed thereon so that the release-treated surface of the PET sheet was in contact with the applied composition, thereby obtaining a laminate. This laminate was heated in an oven at 115° C. for 2 minutes. The laminate was removed from the oven, and then the two PET sheets were peeled to obtain a 450 μm silicone sheet.

The foam sheets and the silicone sheet obtained in the Examples and the Comparative Example were evaluated. The results are shown in Table 1.

TABLE 1

| | | Example 1 | Example 2 | Example 3 | Comparative Example 1 |
|---|---|---|---|---|---|
| | Type | Foam | Foam | Foam | Non-foaming body |
| | Silicone resin (A) | | | | |
| Formulation (parts by mass) | Base resin | 91 | 91 | 91 | 91 |
| | Curing agent | 9 | 9 | 9 | 9 |
| | Thermal conductor particles (B) | 300 | 400 | 300 | 300 |
| | Methyl ethyl ketone | 3 | 3 | 3 | — |
| Physical properties of foam sheet | Thickness (mm) | 0.45 | 0.4 | 0.66 | 0.45 |
| | Apparent density (g/cm$^3$) | 0.67 | 0.86 | 0.31 | 2.02 |
| | Expansion ratio | 3 | 2.3 | 6.5 | 1 |
| Evaluations of foam sheet | 25% compressive strength (kPa) | 23 | 61 | 21 | 112 |
| | 50% compressive strength (kPa) | 98 | 160 | 73 | 1450 |
| | Thermal conductivity (W/m·K) | 0.38 | 0.47 | 0.22 | 1.2 |

In the foam sheets of Examples 1 to 3, bubbles and thermal conductor particles were contained in the silicone resin (A), and therefore the foam sheets had thinness and flexibility and had excellent thermal conductivity. Particularly, in Examples 1 and 2, in which the expansion ratio was relatively low, the thermal conductivity was sufficiently high while the compressive strength was made good.

On the other hand, in Comparative Example 1, no bubbles were contained. Therefore when the thickness was similar to the thicknesses of Examples 1 to 3, the compressive strength increased, and flexibility could not be provided.

The invention claimed is:

1. A thermally conductive foam sheet for electronic equipment, comprising: a silicone resin (A); and thermal conductor particles (B) and bubbles dispersed in the silicone resin (A), wherein
    a content of the thermal conductor particles (B) is 100 to 400 parts by mass based on 100 parts by mass of the silicone resin (A),
    the thermal conductor particles (B) have an average particle diameter of 50 μm or less and a thermal conductivity of 8 W/m·K or more, and
    the thermally conductive foam sheet has a 25% compressive strength of 200 kPa or less and a thickness of 0.8 mm or less.

2. The thermally conductive foam sheet for electronic equipment according to claim 1, having a 50% compressive strength of 200 kPa or less.

3. The thermally conductive foam sheet for electronic equipment according to claim 1, wherein the thermal conductor particles (B) are of at least one selected from the group consisting of aluminum oxide, magnesium oxide, boron nitride, talc, and aluminum nitride.

4. The thermally conductive foam sheet for electronic equipment according to claim 1, having a thermal conductivity of 0.1 to 10 W/m·K.

5. The thermally conductive foam sheet for electronic equipment according to claim 1, having an expansion ratio of 1.5 to 5.

6. The thermally conductive foam sheet for electronic equipment according to claim 1, wherein the bubbles are formed by foaming with a physical foaming agent, are formed by a gas mixed by a mechanical frothing method, or both thereof.

7. A method of manufacturing the thermally conductive foam sheet for electronic equipment according to claim 1, comprising:
    forming bubbles in a foam composition comprising a curable silicone resin composition and thermally conductive particles (B); and curing the curable silicone resin composition to obtain a foam sheet.

* * * * *